(12) United States Patent
Liu et al.

(10) Patent No.: US 9,611,141 B2
(45) Date of Patent: Apr. 4, 2017

(54) SELF-REMOVAL ANTI-STICTION COATING FOR BONDING PROCESS

(71) Applicant: Taiwan Semiconductor Manufacturing Company, Ltd., Hsin-Chu (TW)

(72) Inventors: Ping-Yin Liu, Yonghe (TW); Li-Cheng Chu, Taipei (TW); Hung-Hua Lin, Taipei (TW); Shang-Ying Tsai, Pingzhen (TW); Yuan-Chih Hsieh, Hsinchu (TW); Jung-Huei Peng, Jhubei (TW); Lan-Lin Chao, Sindian (TW); Chia-Shiung Tsai, Hsin-Chu (TW); Chun-Wen Cheng, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 73 days.

(21) Appl. No.: 14/564,346

(22) Filed: Dec. 9, 2014

(65) Prior Publication Data

US 2016/0229693 A1    Aug. 11, 2016

Related U.S. Application Data

(62) Division of application No. 12/964,347, filed on Dec. 9, 2010, now Pat. No. 8,905,293.

(51) Int. Cl.
*H01L 29/93* (2006.01)
*B81C 1/00* (2006.01)
(Continued)

(52) U.S. Cl.
CPC ............ *B81C 1/00269* (2013.01); *B32B 7/12* (2013.01); *B32B 15/043* (2013.01); *B32B 15/20* (2013.01);
(Continued)

(58) Field of Classification Search
CPC ... B81B 7/007; B81B 3/0005; B81C 1/00984; B81C 1/00269; B81C 2201/112;
(Continued)

(56) References Cited

U.S. PATENT DOCUMENTS 5,694,740 A    12/1997 Martin
6,500,760 B1    12/2002 Peterson
(Continued)

*Primary Examiner* — Stephen W Smoot
*Assistant Examiner* — Vicki B Booker
(74) *Attorney, Agent, or Firm* — Haynes and Boone, LLP

(57) ABSTRACT

The present disclosure provides a device having a doped active region disposed in a substrate. The doped active region having an elongate shape and extends in a first direction. The device also includes a plurality of first metal gates disposed over the active region such that the first metal gates each extend in a second direction different from the first direction. The plurality of first metal gates includes an outer-most first metal gate having a greater dimension measured in the second direction than the rest of the first metal gates. The device further includes a plurality of second metal gates disposed over the substrate but not over the doped active region. The second metal gates contain different materials than the first metal gates. The second metal gates each extend in the second direction and form a plurality of respective N/P boundaries with the first metal gates.

20 Claims, 6 Drawing Sheets

(51) Int. Cl.
*B32B 7/12* (2006.01)
*B32B 15/04* (2006.01)
*B32B 15/20* (2006.01)
*B81B 3/00* (2006.01)

(52) U.S. Cl.
CPC ........ *B81B 3/0005* (2013.01); *B32B 2255/24* (2013.01); *B32B 2307/746* (2013.01); *B32B 2457/00* (2013.01); *B81C 2201/112* (2013.01); *Y10T 428/12674* (2015.01); *Y10T 428/12708* (2015.01); *Y10T 428/12736* (2015.01); *Y10T 428/12986* (2015.01)

(58) Field of Classification Search
CPC ......... B32B 7/12; B32B 15/043; B32B 15/20; B32B 2255/24; B32B 2457/00; B32B 2307/746; Y10T 428/12674; Y10T 428/12986; Y10T 428/12708; Y10T 428/12736
See application file for complete search history.

(56) References Cited

U.S. PATENT DOCUMENTS

| | | |
|---|---|---|
| 6,906,845 B2 | 6/2005 | Cho |
| 6,930,367 B2 | 8/2005 | Lutz |
| 7,307,775 B2 | 12/2007 | Patel |
| 7,463,404 B2 | 12/2008 | Chen |
| 7,628,309 B1 | 12/2009 | Eriksen |
| 8,207,586 B2 | 6/2012 | Sato |
| 2003/0054588 A1 | 3/2003 | Patel |
| 2006/0220223 A1 | 10/2006 | Lu et al. |
| 2007/0048887 A1 | 3/2007 | Erlach et al. |
| 2009/0029152 A1 | 1/2009 | Yun |
| 2011/0012247 A1 | 1/2011 | Wu |
| 2011/0159627 A1* | 6/2011 | Mantravadi ......... B81C 1/00182 438/52 |
| 2012/0148870 A1 | 6/2012 | Liu |

* cited by examiner

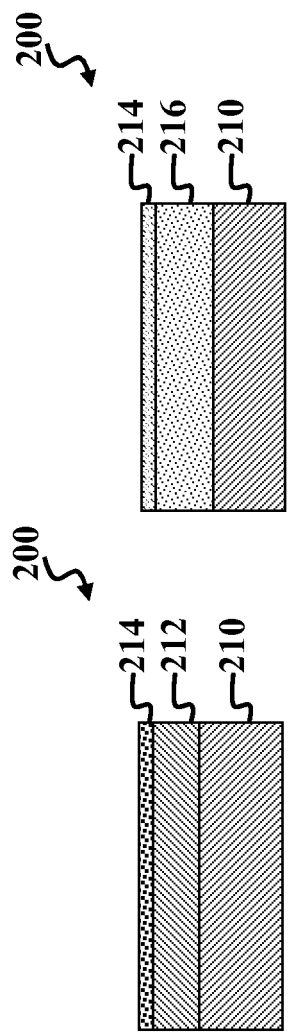

SELF-REMOVAL ANTI-STICTION COATING FOR BONDING PROCESS

PRIORITY DATA

The present application is a divisional application of U.S. patent application Ser. No. 12/964,347, filed Dec. 9, 2010, now U.S. Pat. No. 8,905,293, which is incorporated herein by reference in its entirety.

BACKGROUND

Microelectromechanical systems (MEMS) devices are very small electro-mechanical systems incorporated into integrated circuit devices. Because MEMS devices typically have large surface area to volume ratios, they are susceptible to adhesion (stiction). Anti-stiction layers, such as self-assembled monolayers (SAMs), have thus been implemented to coat the MEMS devices. Though anti-stiction layers effectively prevent stiction, these layers present issues during packaging, particularly when using wafer level packaging (WLP) technology (which provides for packaging integrated circuit devices at wafer level). More specifically, anti-stiction layers prevent effective bonding during the packaging process. To address this issue, conventional approaches use an ultraviolet (UV) treatment (such as a UV ozone treatment) to selectively remove the anti-stiction layer from bonding areas of the devices. However, UV treatment typically requires extra processing, leading to extra fabrication costs. Accordingly, although existing approaches for removing anti-stiction layers from bonding areas of a device have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-4 are diagrammatic cross-sectional views of a bonding portion of a device during various stages of the bonding method of FIG. 1.

DETAILED DESCRIPTION

Figure 1:
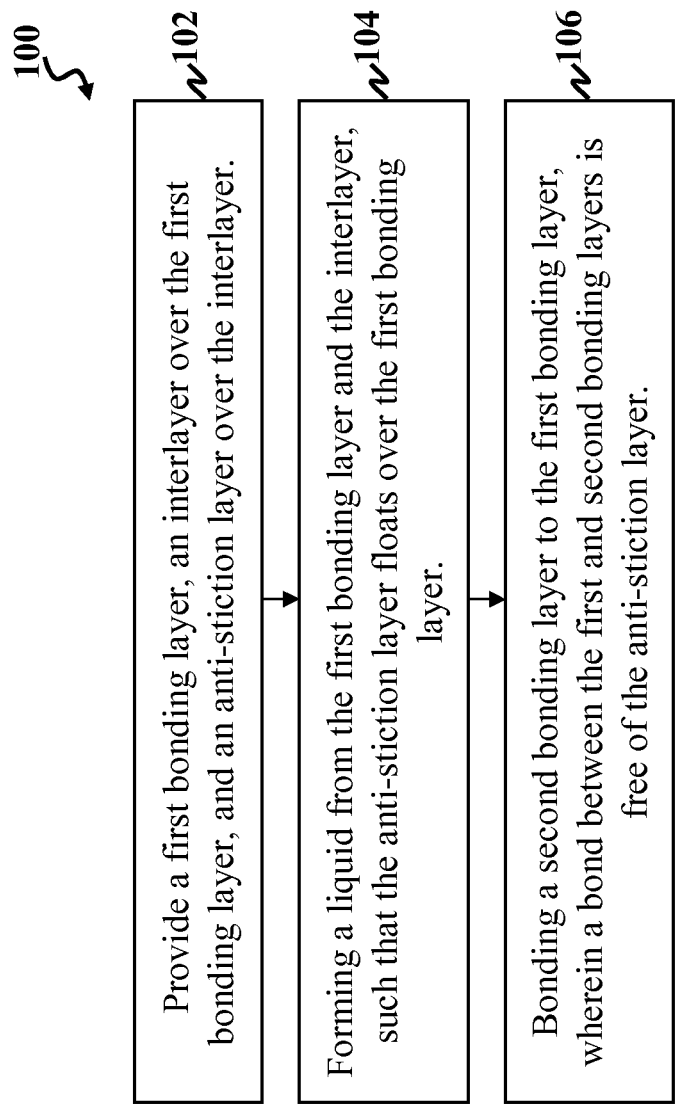
FIG. 1 is a flow chart of a method for bonding according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, descriptions of a first feature "on" or "over" a second feature (and like descriptions) may include embodiments where the first and second features are in direct contact, and may also include embodiments where additional features are interposed between the first and second features. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flow chart of a method 100 for bonding according to various aspects of the present disclosure. The method 100 begins at block 102 by providing a first bonding layer, an interlayer over the first bonding layer, and an anti-stiction layer over the interlayer. At block 104, a liquid is formed from the first bonding layer and the interlayer, such that the anti-stiction layer floats over the first bonding layer. For example, heating the first bonding layer and the interlayer to their eutectic temperatures causes material at an interface of the first bonding layer and interlayer to diffuse together and form an alloy including material from the first bonding layer and the interlayer. The alloy is in the liquid phase, causing the anti-stiction layer to "float" over the first bonding layer. The heating may also melt the anti-stiction layer. The method 100 continues with block 106 by bonding a second bonding layer to the first bonding layer. A bond between the first and second bonding layers is free of the anti-stiction layer. For example, the second bonding layer is pressed into the anti-stiction layer while the liquid is formed from the first bonding layer and the interlayer. By applying force to the second bonding layer, the floating anti-stiction layer squeezes out from underneath the second bonding layer, allowing the second bonding layer to couple with the first bonding layer. Additional steps can be provided before, during, and after the method 100, and some of the steps described can be replaced or eliminated for other embodiments of the method. The discussion that follows illustrates various embodiments of bonding that can be achieved according to the method 100 of FIG. 1.

FIGS. 2-4 are diagrammatic cross-sectional views of a bonding portion of a device 200 during various stages of the method 100 of FIG. 1. FIGS. 2-4 have been simplified for the sake of clarity to better understand the inventive concepts of the present disclosure. Additional features can be added in the device 200, and some of the features described below can be replaced or eliminated for additional embodiments of the device 200.

In FIG. 2, the device 200 includes a bonding layer 210 having an interlayer 212 disposed thereover. The bonding layer 210 and interlayer 212 each include a conductive material, such as Al (aluminum), Ge (germanium), In (indium), Au (gold), Sn (tin), Cu (copper), other conductive material, alloys thereof (such as AlGe or AuSn), or combinations thereof. The bonding layer 210 and/or interlayer 212 may include a multilayer structure. For example, the interlayer 212 could include an Al layer/Ge layer, Au layer/Sn layer, or Al layer/Ge layer/Au layer/Sn layer structure. The bonding layer 210 and interlayer 212 may be formed by chemical vapor deposition (CVD), physical vapor deposition (PVD), plating, other suitable process, or combinations thereof.

In the depicted embodiment, the conductive materials of the bonding layer 210 and interlayer 212 are selected such that a eutectic bond can be formed between the bonding layer 210 and interlayer 212. For example, in the depicted embodiment, the bonding layer 210 is an AlCu layer, and the interlayer 212 is a Ge layer. The AlCu bonding layer 210 has any suitable Al to Cu ratio, such as an Al:Cu ratio of 99.5:0.5 or Al:Si:Cu ratio of 97.5:2.0:0.5. Alternatively, the bonding layer 210/interlayer 212 combination may be Al/Ge, Al/In, Al/Au, Sn/Au, or other suitable combination. The bonding layer 210 and interlayer 212 have suitable thicknesses. In the depicted embodiment, the bonding layer 210 has a thickness greater than about 10 Å, and the interlayer 212 has a thickness greater than about 5 Å. A ratio of the thickness of the interlayer 212 and the thickness of the bonding layer 210 (thickness$_{bonding\ layer}$/thickness$_{interlayer}$) may be about 0.5 to about 0.9. For example, where the bonding layer 210 has a thickness of about 10 Å and the interlayer 212 has a thickness about 5 Å, the ratio of the thicknesses (thickness$_{bonding\ layer}$/thickness$_{interlayer}$) is about 0.5.

An anti-stiction layer 214 is disposed over the interlayer 212. The anti-stiction layer 214 is an organic based material. In the depicted embodiment, the anti-stiction layer 214 includes self-assembled monolayers (SAMs). The anti-stiction layer 214 may be formed by molecular vapor deposition (MVD) or other suitable process.

In FIG. 3, a eutectic (wetting) reaction occurs between the bonding layer 210 and interlayer 212, thereby forming eutectic alloy layer 216. The eutectic reaction is achieved by heating the bonding layer 210 and interlayer 212 to their eutectic temperature, the temperature at which a combination of the bonding layer 210 and interlayer 212 initially forms a liquid or molten state (eutectic state). In an example, the bonding layer 210 and interlayer 212 are heated to a temperature of about 420° C. to about 440° C. When the bonding layer 210 and interlayer 212 are at their eutectic temperatures, the materials at the interface of the bonding layer 210 and interlayer 212 diffuse together to form an alloy composition—the eutectic alloy layer 216—in a liquid phase. In the depicted embodiment, the interlayer 212 is completely consumed during the eutectic reaction, leaving a structure having the bonding layer 210 and eutectic alloy layer 216. Alternatively, the interlayer 212 is not completely consumed during the eutectic reaction, leaving a structure having the bonding layer 210, the eutectic alloy layer 216 over the bonding layer 210, and remaining interlayer 212 over the eutectic alloy layer 216. The anti-stiction layer "floats" over the liquid phase bonding layer 210/interlayer 212, specifically over the eutectic alloy layer 216. More specifically, as the temperature rises yet remains below a eutectic point of the bonding layer 210 and interlayer 212, the bonding layer 210 and the interlayer 212 are in a solid state while some inter-diffusion occurs between the bonding layer 210 and interlayer 212 at their interface (for example, Al (solid)+Ge (solid)→inter-diffusion). As the temperature is close to the eutectic point and reaches the eutectic point, bonding layer 210 and the interlayer 212 diffuse together in an alloy phase (also referred to as a wetting, soft, or floating phase), thereby forming the eutectic alloy layer 216 (for example, Al (solid)+Ge (solid)→AlGe alloy phase). The anti-stiction layer 214 floats above the eutectic alloy layer 216 (or the bonding layer 210/interlayer 212 in their alloy phase).

In FIG. 4, a bonding layer 218 is bonded with the bonding layer 210. In the depicted embodiment, the bonding layer 218 includes silicon, such as amorphous silicon. Alternatively, the bonding layer may include TiSi or other suitable material. The bonding layer 218 is pressed into the anti-stiction layer 214 until the bonding layer 218 contacts the eutectic alloy layer 216 and/or bonding layer 210. Where the interlayer 212 remains, the bonding layer 218 may be pressed into the anti-stiction layer 214 until it contacts the interlayer 212. The bonding between the bonding layer 210 and bonding layer 218 may be achieved by thermal compressive bonding, thermal diffusion bonding, or eutectic bonding. In the depicted embodiment, since the anti-stiction layer 214 "floats" over the eutectic alloy layer 216, the anti-stiction layer 214 selectively removes itself from underneath the bonding layer 218 as force is applied to the bonding layer 218. This couples the bonding layer 218 with the bonding layer 210, forming a bond including the bonding layer 218, eutectic alloy layer 216, and bonding layer 210. As illustrated in FIG. 4, the bond is free of the anti-stiction layer 214.

FIGS. 5-8 are diagrammatic cross-sectional views of an integrated circuit device 300, in portion or entirety, at various stages of the method 100 of FIG. 1. In the depicted embodiment, FIGS. 5-8 illustrate wafer level packaging (WLP) technology according to the method 100, which is not intended to be limiting. Other packaging technologies may utilize the method 100 and features described herein. FIGS. 5-8 have been simplified for the sake of clarity to better understand the inventive concepts of the present disclosure. Additional features can be added in the integrated circuit device 300, and some of the features described below can be replaced or eliminated in other embodiments of the integrated circuit device 300.

Figure 5:
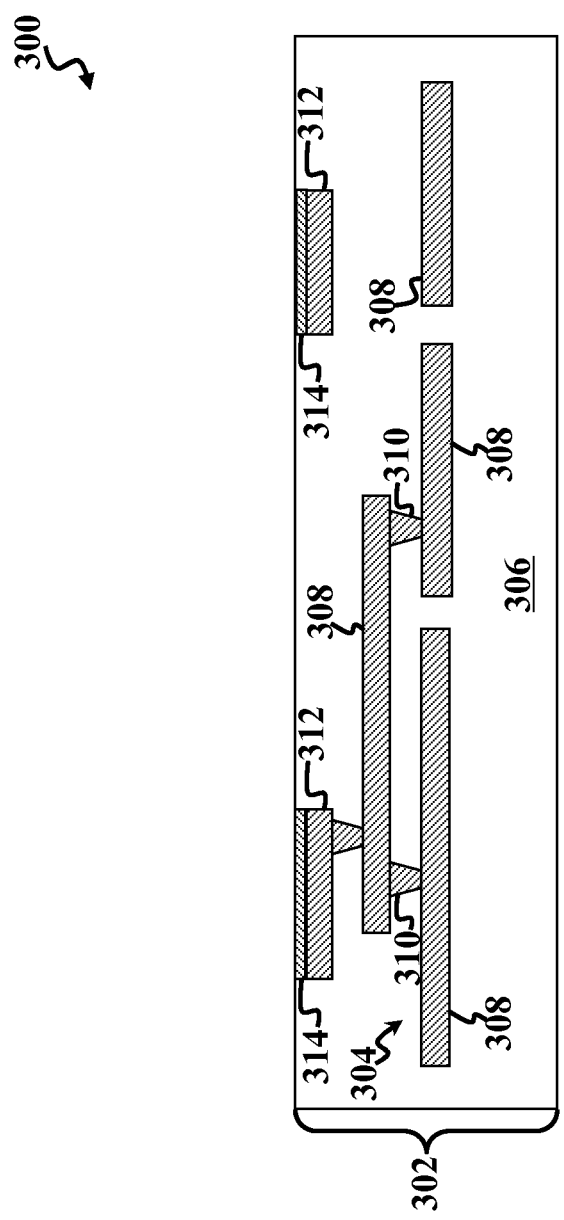
FIGS. 5-8 are diagrammatic cross-sectional views of a device during various stages of the bonding method of FIG. 1.

In FIG. 5, a substrate 302 of the integrated circuit device 300 is provided. The substrate 302 includes various layers that are not separately depicted and that can combine to form various microelectronic elements that may include: transistors (for example, metal-oxide-semiconductor field effect transistors (MOSFET) including complementary metal-oxide-semiconductor (CMOS) transistors, bipolar junction transistors (BJT), high voltage transistors, high frequency transistors, p-channel and/or n-channel field effect transistors (PFETs/NFETs)); resistors; diodes; capacitors; inductors; fuses; and/or other suitable elements. The various layers may include high-k dielectric layers, gate layers, hard mask layers, interfacial layers, capping layers, diffusion/barrier layers, dielectric layers, conductive layers, other suitable layers, or combinations thereof. The microelectronic elements could be interconnected to one another to form a portion of the integrated circuit device 300, such as a logic device, memory device (for example, a static random access memory (SRAM)), radio frequency (RF) device, input/output (I/O) device, system-on-chip (SoC) device, other suitable types of devices, or combinations thereof. In the depicted embodiment, the substrate 302 includes an integrated circuit device (or portion thereof) designed and formed by CMOS based processes. The substrate 302 is thus referred to as a CMOS substrate. A substrate including a device formed using other integrated circuit fabrication technologies is also within the scope of the present disclosure.

The CMOS substrate 302 includes a multilayer interconnect (MLI) structure 304 formed in an insulating layer 306 (for example, one or more interlayer dielectric (ILD) layers) of the substrate 302. The insulating layer 306 includes a dielectric material, such as silicon oxide, silicon nitride, silicon oxynitride, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, parylene, BCB (bis-benzocyclobutenes), SiLK (Dow Chemical, Midland, Mich.), polyimide, other dielectric material, or combinations thereof. The MLI structure 304 includes various horizontal conductive features 308, such as metal lines, and vertical conductive features 310, such as contacts and vias. A contact is configured to connect metal lines with the substrate, and a via is configured to connect metal lines. The various features of the MLI structure 304 may include various conductive materials including copper, tungsten, and/or silicide. In an example, a damascene and/or dual damascene process forms a copper related MLI structure.

The CMOS substrate 302 also includes a bonding layer 312. In the depicted embodiment, the bonding layer 312 is the topmost metal layer of the MLI structure 304. Alternatively, the bonding layer 312 could be a layer separate and apart from the MLI structure 304. The bonding layer 312 includes a conductive material, such as Al, Ge, In, Au, Sn, Cu, other conductive material, alloys thereof, or combinations thereof. The bonding layer 312 may include a multilayer structure. In the depicted embodiment, the bonding layer 312 includes an AlCu layer. The AlCu bonding layer 312 has any suitable Al to Cu ratio, such as an Al:Cu ratio of 99.5:0.5 or Al:Si:Cu ratio of 97.5:2.0:0.5. The bonding layer 312 may be formed by CVD, PVD, plating, other suitable process, or combinations thereof. Other manufacturing techniques implemented to form the bonding layer 312 may include photolithography processing and/or etching to pattern and define the bonding layer 312 as illustrated in FIG. 5.

An interlayer 314 is disposed over the bonding layer 312. The interlayer 314 includes a conductive material, such as Al, Ge, In, Au, Sn, Cu, other conductive material, alloys thereof (such as AlGe or AuSn), or combinations thereof. In the depicted embodiment, the interlayer 314 is a Ge layer. The interlayer 314 may include a multilayer structure. For example, the interlayer 314 could include an Al layer/Ge layer, Au layer/Sn layer, or Al layer/Ge layer/Au layer/Sn layer structure. In the depicted embodiment, the interlayer 314 has a thickness less than or equal to about 1000 Å, and may be formed by CVD, PVD, plating, other suitable process, or combinations thereof. Other manufacturing techniques implemented to form the interlayer 314 may include photolithography processing and/or etching to pattern and define the interlayer 314 as illustrated in FIG. 5. In the depicted embodiment, the bonding layer 312 and interlayer 314 are simultaneously patterned. For example, patterning the bonding layer 312 and interlayer 314 may include depositing the bonding layer 312 over the insulating layer 306, depositing the interlayer 314 over the bonding layer 312, depositing a photoresist layer over the interlayer 314, exposing and developing the photoresist layer to define a patterned photoresist layer, etching the pattern of the patterned photoresist layer into the interlayer 314 and bonding layer 312, stripping the patterned photoresist layer, forming a dielectric layer over the defined interlayer 314 and bonding layer 312, and planarizing the dielectric layer (which may be considered a part of the insulating layer 306).

Figure 6:
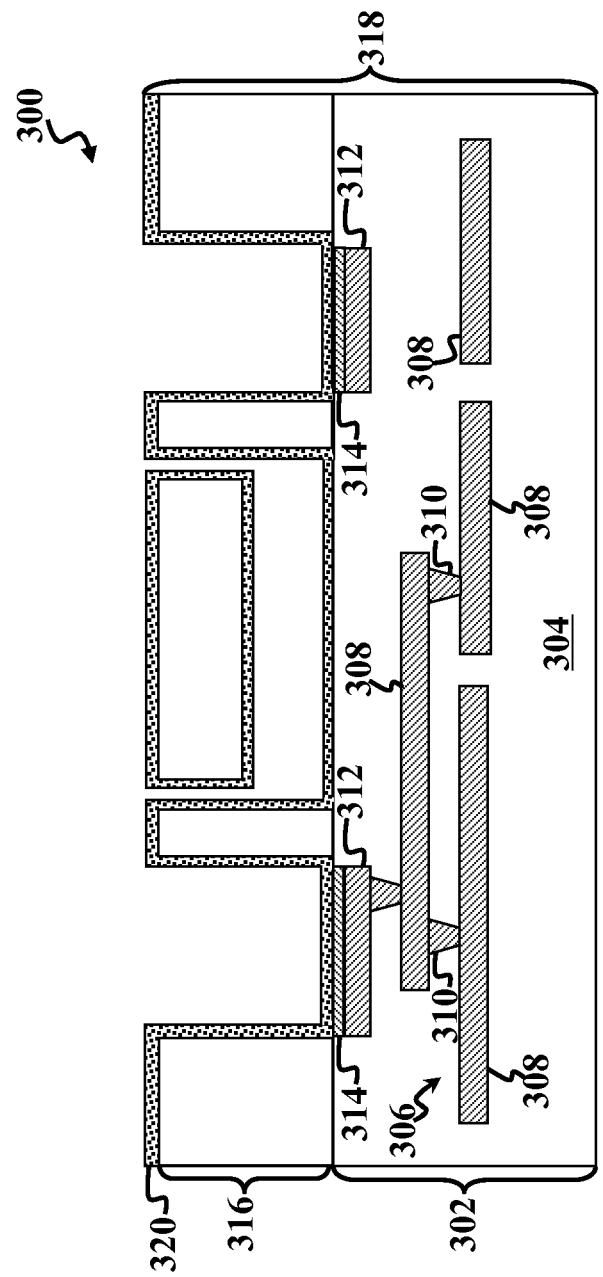

In FIG. 6, a substrate 316 is bonded to (coupled with) the substrate 302, collectively forming a device substrate 318. The substrate 316 includes a device designed to interface with the substrate 302. For example, in the depicted embodiment, the substrate 316 includes a microelectromechanical system (MEMS) device. Accordingly, the substrate 316 is referred to as a MEMS substrate. The MEMS device is a MEMS device of a known type, such as a motion sensor (for example, a gyroscope or an accelerometer). Alternatively, the MEMS device could be a RF MEMS device (for example, an RF switch or filter), an oscillator, a MEMS microphone, and/or any other MEMS type device, including future MEMS type devices. One of ordinary skill in the art will recognize that the MEMS device could alternatively include nanoelectromechanical elements, for example, the MEMS device could alternatively be a nanoelectromechanical system (NEMS) device. The substrate 316 may also include microelectronic elements, such as those described above with reference to substrate 302. Where the substrate 316 includes various microelectronic elements, the MEMS device could be interconnected to the microelectronic elements. The MEMS device may be interconnected with the various microelectronic elements of substrate 302.

An anti-stiction layer 320 is formed over the substrate 316. In the depicted embodiment, the anti-stiction layer 320 coats the MEMS device. Further, the anti-stiction layer 320 is disposed over the interlayer 314 in the bonding portion (region) of the device substrate 318. The anti-stiction layer 320 is an organic based material. In the depicted embodiment, the anti-stiction layer 320 includes one or more self-assembled monolayers (SAMs). The anti-stiction layer 320 may be formed by MVD or other suitable process.

Figure 7:
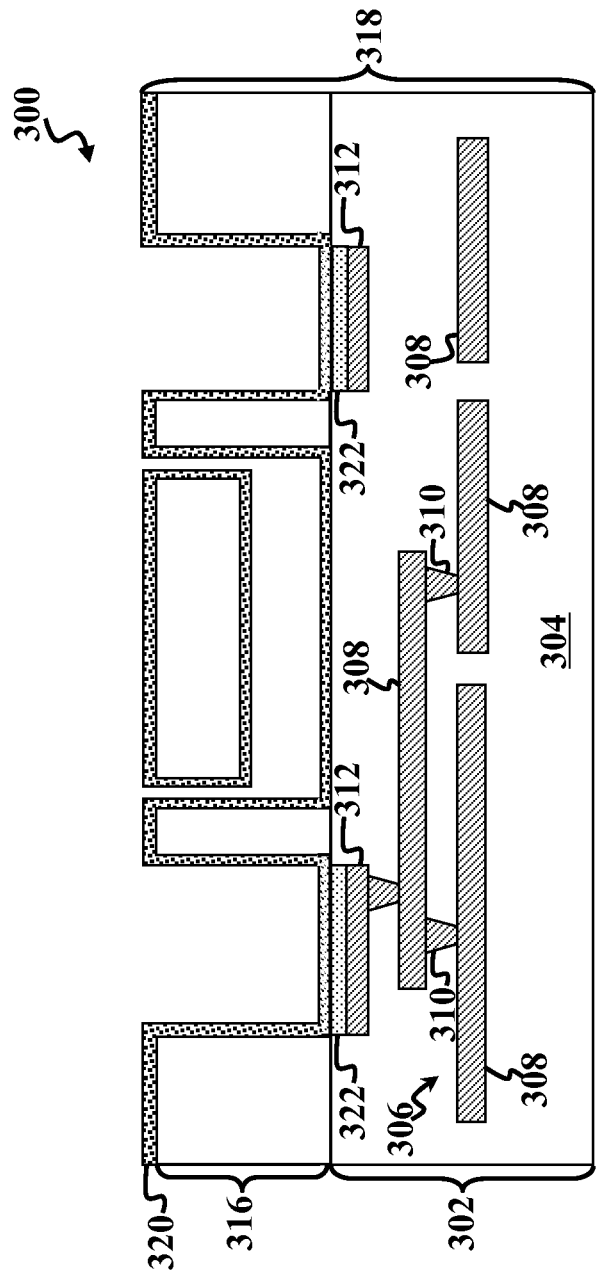

In FIG. 7, a eutectic (wetting) reaction occurs between the bonding layer 312 and interlayer 314, thereby forming eutectic alloy layer 322. The eutectic reaction is achieved by heating the substrate 318 so that the bonding layer 312 and interlayer 314 reach their eutectic temperature, the temperature at which a combination of the bonding layer 312 and interlayer 314 initially forms a liquid or molten state (eutectic state). In an example, the bonding layer 312 and interlayer 314 are heated to a temperature of about 420° C. to about 440° C. When the bonding layer 312 and interlayer 314 are at their eutectic temperatures, the materials at the interface of the bonding layer 312 and interlayer 314 diffuse together to form an alloy composition—the eutectic alloy layer 322—in a liquid phase. In the depicted embodiment, the interlayer 314 is completely consumed during the eutectic reaction, leaving a structure having the bonding layer 312 and eutectic alloy layer 322. Alternatively, the interlayer 314 is not completely consumed during the eutectic reaction, leaving a structure having the bonding layer 312, the eutectic alloy layer 322 over the bonding layer 312, and remaining interlayer 314 over the eutectic alloy layer 322. The anti-stiction layer "floats" over the liquid phase bonding layer 312/interlayer 314, specifically over the eutectic alloy layer 322. The anti-stiction layer 320 may melt during the eutectic (wetting) reaction.

Figure 8:
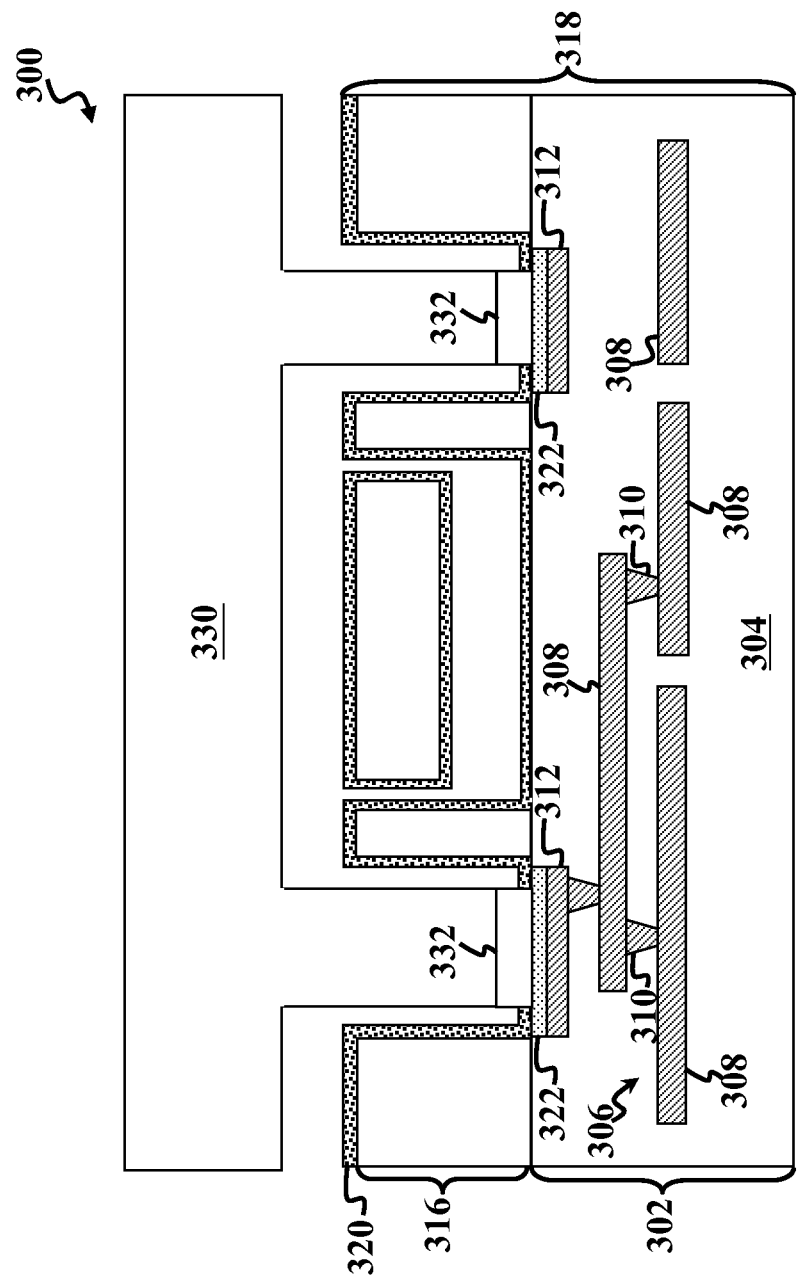

In FIG. 8, a substrate 330 is bonded to the device substrate 318. The substrate 330 is referred to as a capping substrate. The capping substrate 330 includes a suitable material. In the depicted embodiment, the capping substrate 330 includes stand-off features having a bonding layer 332. Lithography processing and/or etching may be used to pattern and define the stand-off features having the bonding layer 332 as illustrated in FIG. 8. In the depicted embodiment, the bonding layer 332 includes silicon, such as amorphous silicon. Alternatively, the bonding layer may include TiSi or other suitable material. In the depicted embodiment, the capping substrate 330 and device substrate 318 are bonded by coupling the bonding layers 312 and 332. More specifically, while the eutectic alloy layer 322 is in a liquid phase, the bonding layer 332 is pressed into the anti-stiction layer 320 until the bonding layer 332 contacts the eutectic alloy layer 322 and/or bonding layer 312. Where the interlayer 314 remains, the bonding layer 332 may be pressed into the anti-stiction layer 320 until it contacts the interlayer 314. The bonding between the bonding layers 332 and 312 may be achieved by thermal compressive bonding, thermal diffusion bonding, or eutectic bonding. In the depicted embodiment, since the anti-stiction layer 320 "floats" over the eutectic alloy layer 322, the anti-stiction layer 320 selectively removes itself from underneath the bonding layer 332 as force is applied to the capping substrate 330 (bonding layer 332). This couples the bonding layer 332 with the bonding layer 312, forming a bond including the bonding layer 332, eutectic alloy layer 322, and bonding layer 312. As illustrated in FIG. 8, the bond is free of the anti-stiction layer 320. It should be noted that because the eutectic alloy layer 322 forms only in the bond regions of the substrates 318 and 330, the anti-stiction layer 320 self-aligns in the bonding region, while remaining on the MEMS device of the MEMS substrate 316.

Thus, the present disclosure provides a self-removal anti-stiction coating that is compatible with packaging technology, particularly wafer level packaging technology. The disclosed "floating" anti-stiction layer eliminates the need for costly and timely ultraviolet (UV) treatments to remove the anti-stiction layer from bonding regions of a device. Instead, the floating anti-stiction layer self-aligns in the bonding regions of the device, providing improved bonds between substrates. The present disclosure thus provides a method that integrates anti-stiction layer removal and device packaging in one process. Different embodiments may have different advantages, and no particular advantage is necessarily required of any embodiment.

In an example, a method includes forming a first bonding layer; forming an interlayer over the first bonding layer; forming an anti-stiction layer over the interlayer; and forming a liquid from the first bonding layer and interlayer, such that the anti-stiction layer floats over the first bonding layer. A second bonding layer can be bonded to the first bonding layer while the anti-stiction layer floats over the first bonding layer, such that a bond between the first and second bonding layers is free of the anti-stiction layer. Forming the liquid from the first bonding layer and the interlayer may include causing an eutectic reaction between the first bonding layer and the interlayer. The eutectic reaction may form a eutectic alloy layer. In an example, the eutectic reaction may completely consume the interlayer. Bonding the second bonding layer to the first bonding layer while the anti-stiction layer floats over the first bonding layer can include coupling the second bonding layer with the first bonding layer by applying force to the second bonding layer, wherein the applied force causes the anti-stiction layer to squish out from between the first and second bonding layers. The bonding may include thermal compressive bonding, a thermal diffusion bonding, or eutectic bonding. The anti-stiction layer may melt when the liquid is formed from the first bonding layer and the interlayer. In an example, the first bonding layer, interlayer, and anti-stiction layer are formed in a bonding region of a device; and forming the liquid and bonding the second bonding layer to the first bonding layer includes the anti-stiction layer self-aligning in the bonding region.

In another example, a method includes providing a first substrate including a first bonding portion that includes a first bonding layer, an interlayer disposed over the first bonding layer, and an anti-stiction layer disposed over the interlayer; providing a second substrate having a second bonding portion that includes a second bonding layer; and coupling the first bonding layer with the second bonding layer, such that the first substrate is bonded with the second substrate, wherein the coupling includes using an eutectic reaction between the first bonding layer and the interlayer to selectively remove the anti-stiction layer from the coupled first and second bonding layers. The eutectic reaction may include forming a liquid from the first bonding layer and the interlayer. In an example, the first and second bonding layers are coupled together by pressing the second bonding layer into the first bonding portion, wherein the pressing includes applying force to the second bonding layer, such that the anti-stiction layer squeezes out from underneath the second bonding layer. The eutectic reaction may melt the anti-stiction layer. In an example, the eutectic reaction forms a eutectic alloy layer, and the second bonding layer may be bonded with the eutectic alloy layer. The first substrate may be a device substrate including a microelectromechanical (MEMS) device, where the anti-stiction layer coats the MEMS device. The first substrate may be a CMOS substrate, a CMOS with MEMS substrate, or a MEMS substrate. The second substrate may also be a CMOS substrate, a CMOS with MEMS substrate, or a MEMS substrate.

In another example, a device includes a first substrate having a first bonding portion and a device coated with an anti-stiction layer. The first bonding portion includes a first bonding layer and an eutectic alloy layer disposed over the first bonding layer, where the eutectic alloy layer includes a portion free of the anti-stiction layer and a portion having the anti-stiction layer disposed thereover. The device further includes a second substrate having a second bonding portion that includes a second bonding layer. The second substrate is bonded to the first substrate by a bond that includes the second bonding layer, the eutectic alloy layer, and the first bonding layer, where the second bonding layer is coupled with the portion of the eutectic alloy layer free of the anti-stiction layer. In an example, the first bonding layer includes aluminum; the eutectic alloy layer includes one of germanium, indium, aluminum, gold, tin, and combinations thereof; and the second bonding layer includes silicon. The device coated with the anti-stiction layer may be a MEMS device, and the anti-stiction coating may be a self assembled monolayers (SAMS) layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
   a first substrate having a first bonding portion and a device, the first substrate coated with an anti-stiction layer, the first bonding portion including a first bonding layer and an eutectic alloy layer disposed over the first bonding layer, wherein the eutectic alloy layer includes a portion free of the anti-stiction layer and a portion having the anti-stiction layer disposed thereover; and
   a second substrate having a second bonding portion that includes a second bonding layer, the second substrate being bonded to the first substrate by a bond that includes the second bonding layer, the eutectic alloy layer, and the first bonding layer, wherein the second bonding layer is coupled with the portion of the eutectic alloy layer free of the anti-stiction layer, wherein second bonding layer includes opposing sidewall surfaces and bottommost surface extending between the opposing sidewall surfaces, and wherein the anti-stiction layer physically contacts the opposing sidewall surfaces without physically contacting the bottommost surface.
2. The device of claim 1 wherein the first bonding layer includes aluminum.
3. The device of claim 1 wherein the eutectic alloy layer includes one of germanium, indium, aluminum, gold, tin, and combinations thereof.

4. The device of claim 1 wherein the device coated with the anti-stiction layer is a MEMS device.

5. The device of claim 1 wherein the second bonding layer includes silicon.

6. The device of claim 1 wherein the anti-stiction coating is a self assembled monolayers (SAMS) layer.

7. The device of claim 1, further comprising a third substrate disposed between the first and second substrates, wherein the third substrate is bonded to the first substrate, and wherein the anti-stiction layer is disposed over a top surface of the third substrate facing away from the first substrate.

8. A device comprising:
a first substrate having a first bonding layer and a eutectic alloy layer disposed thereover, wherein the eutectic alloy is formed by heating a portion of the first bonding layer;
an anti- stiction layer disposed over the eutectic alloy layer of the first substrate, wherein the anti-stiction layer is an organic-based material; and
a second substrate having a second bonding layer positioned over the eutectic alloy layer and bonded to the first bonding layer such that a bond between the first and second bonding layers is free of the anti-stiction layer, wherein the second bonding layer is not positioned over the first bonding layer prior to heating the portion of the first bonding layer, wherein second bonding layer includes opposing sidewall surfaces and bottommost surface extending between the opposing sidewall surfaces, and wherein the anti-stiction layer physically contacts the opposing sidewall surfaces without physically contacting the bottommost surface.

9. The device of claim 8, wherein the first substrate further includes an interlayer disposed over the first bonding layer, and
wherein the eutectic alloy is further formed by heating a portion the interlayer.

10. The device of claim 8, wherein the eutectic alloy is further formed by heating an interlayer with the portion of the first bonding layer such that the interlayer is completely consumed during the heating.

11. The device of claim 8, wherein the first bonding layer is formed of a first material and the second bonding layer is formed of a second material that is different from the first material.

12. The device of claim 8, wherein the second bonding layer physically contacts the eutectic alloy layer.

13. The device of claim 8, wherein the eutectic alloy includes Al, Ge, Au, and Sn.

14. The device of claim 8, wherein the first bonding layer is coupled to an interconnect structure of the first substrate.

15. The device of claim 8, further comprising a third substrate disposed between the first and second substrates, wherein the third substrate is bonded to the first substrate, and wherein the anti-stiction layer is disposed over a top surface of the third substrate facing away from the first substrate.

16. A device comprising:
a first substrate having a first bonding layer and a eutectic alloy layer formed thereover;
an anti-stiction layer disposed over the eutectic alloy layer of the first substrate, wherein the anti-stiction layer is an organic-based material;
a second substrate having a second bonding layer positioned over the eutectic alloy layer and bonded to the first bonding layer such that a bond between the first and second bonding layers is free of the anti- stiction layer, wherein the second bonding layer is not positioned over the first bonding layer prior to forming the eutectic alloy over the first substrate; and
a third substrate disposed between the first and second substrates, wherein the third substrate is bonded to the first substrate, and wherein the anti-stiction layer is disposed over a top surface of the third substrate facing away from the first substrate.

17. The device of claim 16, wherein the eutectic alloy includes Al, Ge, Au, and Sn,
wherein the first bonding layer includes Cu and Si, and wherein the second bonding layer includes TiSi.

18. The device of claim 16, wherein the second bonding layer physically contacts the eutectic alloy layer.

19. The device of claim 16, wherein second bonding layer includes a first sidewall surface and an opposing second sidewall surface, wherein a bottommost surface of the second bonding layer extends from the first sidewall surface to the second sidewall surface, and
wherein the anti-stiction layer physically contacts the first and second sidewall surfaces without physically contacting the bottommost surface.

20. The device of claim 16, wherein the eutectic alloy includes In.

* * * * *